United States Patent
Li et al.

(10) Patent No.: US 10,522,367 B2
(45) Date of Patent: Dec. 31, 2019

(54) GETTERING LAYER FORMATION AND SUBSTRATE

(71) Applicant: QUALCOMM Incorporated, San Diego, CA (US)

(72) Inventors: Xia Li, San Diego, CA (US); Bin Yang, San Diego, CA (US); Gengming Tao, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/450,605

(22) Filed: Mar. 6, 2017

(65) Prior Publication Data

US 2018/0254194 A1  Sep. 6, 2018

(51) Int. Cl.
| | |
|---|---|
| H01L 21/265 | (2006.01) |
| H01L 21/322 | (2006.01) |
| H01L 21/02 | (2006.01) |
| H01L 23/29 | (2006.01) |
| H01L 23/31 | (2006.01) |

(52) U.S. Cl.
CPC ........ *H01L 21/3221* (2013.01); *H01L 21/022* (2013.01); *H01L 23/291* (2013.01); *H01L 23/3192* (2013.01); *H01L 21/26506* (2013.01); *H01L 21/3225* (2013.01)

(58) Field of Classification Search
CPC . H01L 21/3221; H01L 21/022; H01L 23/291; H01L 23/3192; H01L 21/3226; H01L 21/187; H01L 21/3225; H01L 21/26506
See application file for complete search history.

(56) References Cited

U.S. PATENT DOCUMENTS

| | | | |
|---|---|---|---|
| 4,659,400 A | 4/1987 | Garbis et al. | |
| 4,885,257 A | 12/1989 | Matsushita | |
| 5,640,049 A * | 6/1997 | Rostoker | H01L 23/5226 257/686 |
| 5,757,063 A * | 5/1998 | Tomita | H01L 21/3221 257/610 |
| 5,798,294 A * | 8/1998 | Okonogi | H01L 21/3221 257/E21.318 |
| 6,083,324 A * | 7/2000 | Henley | H01L 21/2007 148/33.2 |
| 6,358,821 B1 | 3/2002 | Gupta et al. | |

(Continued)

FOREIGN PATENT DOCUMENTS

| | | |
|---|---|---|
| JP | 2005317805 A | 11/2005 |
| JP | 2015216327 A | 12/2015 |
| WO | 2008146442 A1 | 12/2008 |

OTHER PUBLICATIONS

International Search Report and Written Opinion—PCT/US2017/068971—ISA/EPO—Apr. 3, 2018.

*Primary Examiner* — Steven H Loke
*Assistant Examiner* — Juanita B Rhodes
(74) *Attorney, Agent, or Firm* — Seyfarth Shaw LLP

(57) ABSTRACT

An integrated circuit (IC) device may include a substrate having an active device layer. The integrated circuit may also include a first defect layer. The first defect layer may have a first surface facing a backside of the active device layer. The integrated circuit may further include a second defect layer. The second defect layer may face a second surface opposite the first surface of the first defect layer.

19 Claims, 13 Drawing Sheets

(56) References Cited

U.S. PATENT DOCUMENTS

| | | |
|---|---|---|
| 7,202,124 B2 | 4/2007 | Fitzgerald et al. |
| 7,871,904 B2 | 1/2011 | An et al. |
| 8,728,870 B2 | 5/2014 | Tobe et al. |
| 8,846,500 B2 | 9/2014 | Lysacek et al. |
| 2005/0037596 A1* | 2/2005 | Erokhin ............... H01L 21/3226 438/471 |
| 2005/0214973 A1* | 9/2005 | Oyu ....................... H01L 21/304 438/106 |
| 2008/0003782 A1* | 1/2008 | Lysacek .............. H01L 21/3221 438/471 |
| 2009/0102024 A1 | 4/2009 | Takahi et al. |
| 2009/0218661 A1* | 9/2009 | Kurita ..................... C30B 15/00 257/629 |
| 2009/0226737 A1* | 9/2009 | Kurita ............... H01L 27/14689 428/446 |
| 2010/0052018 A1* | 3/2010 | Cohen .................... B82Y 10/00 257/288 |
| 2010/0090303 A1* | 4/2010 | Takizawa .......... H01L 21/26506 257/432 |
| 2012/0205821 A1* | 8/2012 | Tan .......................... H01L 23/26 257/787 |
| 2013/0119516 A1* | 5/2013 | Harame .............. H01L 21/8224 257/565 |
| 2015/0263212 A1* | 9/2015 | Uya ..................... H01L 31/186 257/463 |

\* cited by examiner

GETTERING LAYER FORMATION AND SUBSTRATE

BACKGROUND

Field

The present disclosure relates generally to semiconductor devices, and more specifically, to formation and implementation of substrate defects for capturing contaminants in a substrate.

Background

Wafer assembly and packaging may involve a back-grind of a backside of a wafer after a bump process in the assembly housing. Back-grinding, however, may cause wafer metal contamination (e.g., copper, etc.). Special tuning during the back-grind process damages the backside of the wafer and forms a pseudo gettering layer to trap metal ions, which results in areas of residual stress. As a result, cracks form in the wafer, which traps unwanted contamination of conductive material (e.g., copper, etc.) and may cause the wafer or die to break, especially in the case of back-grinding a thin silicon substrate.

Currently, a wafer backside gettering layer protects the wafer from contamination during a fabrication process. The wafer's backside gettering layer is removed by a back-grind process, which also reduces a thickness of the silicon for packaging. The remaining silicon bulk layer, however, retains weak intrinsic gettering sites, which are not enough to protect from backside contamination after the back-grind process. Moreover, the wafer has several processes that will expose the wafer to further metal contamination. As wafers become thinner to meet the demands of smaller circuits, the contamination will get worse as current methods are inadequate. For example, a packaging process may drive a backside contaminant into an active region of a device, which may cause a junction to short.

It is therefore desirable to fulfill this need with new methodologies and devices for protecting an active region of a device from wafer backside contamination during fabrication to allow for an assembly and/or packaging housing.

It is therefore desirable to fulfill this need with new methodologies and devices for protecting an active region of a device from wafer backside contamination during fabrication to allow for an assembly and/or packaging housing.

SUMMARY

An integrated circuit (IC) device may include a substrate having an active device layer. The integrated circuit may also include a first defect layer. The first defect layer may have a first surface facing a backside of the active device layer. The integrated circuit may further include a second defect layer. The second defect layer may face a second surface opposite the first surface of the first defect layer.

A method of fabricating an integrated circuit (IC) device may include implanting a front-side of a wafer having a backside contaminant capture layer to form a first defect layer. A second defect layer may contact the first defect layer and the backside contaminant capture layer. The method may also include epitaxially growing an active device layer may be on the front-side of the wafer. The method may further include fabricating a back-end-of-line (BEOL) contact layer electrically coupled to the active device layer of the wafer. The method may also include back-grinding the wafer to remove the backside contaminant capture layer.

An integrated circuit (IC) device may include a substrate having an active device layer. The integrated circuit may also include first means for capturing contaminants facing a backside of the active device layer. The integrated circuit may further include second means for capturing contaminants facing the first means for capturing contaminants opposite the active device layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
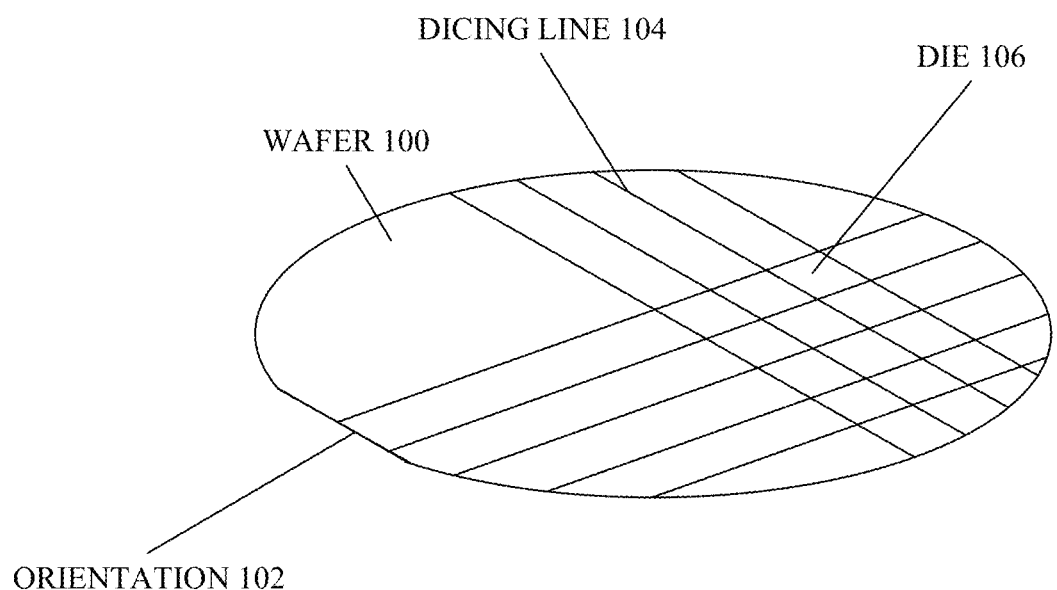
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

The term "exemplary" used throughout this description means "serving as an example, instance, or illustration," and should not necessarily be construed as preferred or advantageous over other aspects of the present disclosure. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Wafer assembly and packaging may involve a back-grind of a backside of a wafer after a bump process in the assembly housing. Back-grinding, however, may cause wafer metal contamination (e.g., copper, etc.). Special tuning during the back-grind process damages the backside of the wafer and forms a pseudo gettering layer to trap metal ions, which results in areas of residual stress. As a result, cracks form in the wafer, which traps unwanted contamination of conductive material (e.g., copper) and may cause the wafer or die to break, especially in the case of back-grinding a thin silicon substrate.

Currently, a wafer backside gettering layer protects the wafer from contamination during a fabrication process. The wafer backside gettering layer is removed by a back-grind process, which also reduces a thickness of the silicon for packaging. The remaining silicon bulk layer, however, retains weak intrinsic gettering sites, which are not enough to protect from backside contamination after the back-grind process. Moreover, the wafer has several processes that will expose the wafer to further metal contamination. As wafers become thinner to meet the demands of smaller circuits, the contamination will get worse as current methods are inadequate. For example, a packaging process may drive a backside contaminant into an active region of a device, which may cause a junction to short.

Aspects of the present disclosure include forming an additional inner gettering layer for protecting an active region of a device from wafer backside contamination during fabrication and for an assembly and/or packaging housing.

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material (e.g., a slice from crystal bar), it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (e.g., either electrons or holes) within the wafer 100 or portions of the wafer 100. By selecting the areas where the extra charge carriers are provided, which type of charge carriers are provided, and the amount (e.g., density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawed or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
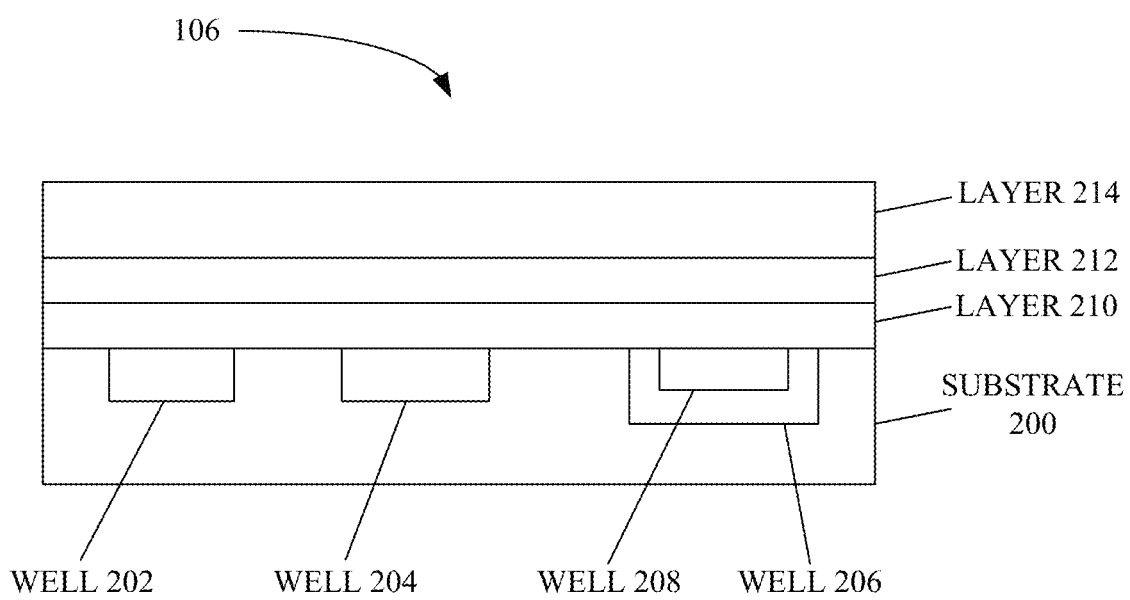
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be a body of a field-effect transistor (FET), or wells 202 and/or 204 may be a substrate body of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
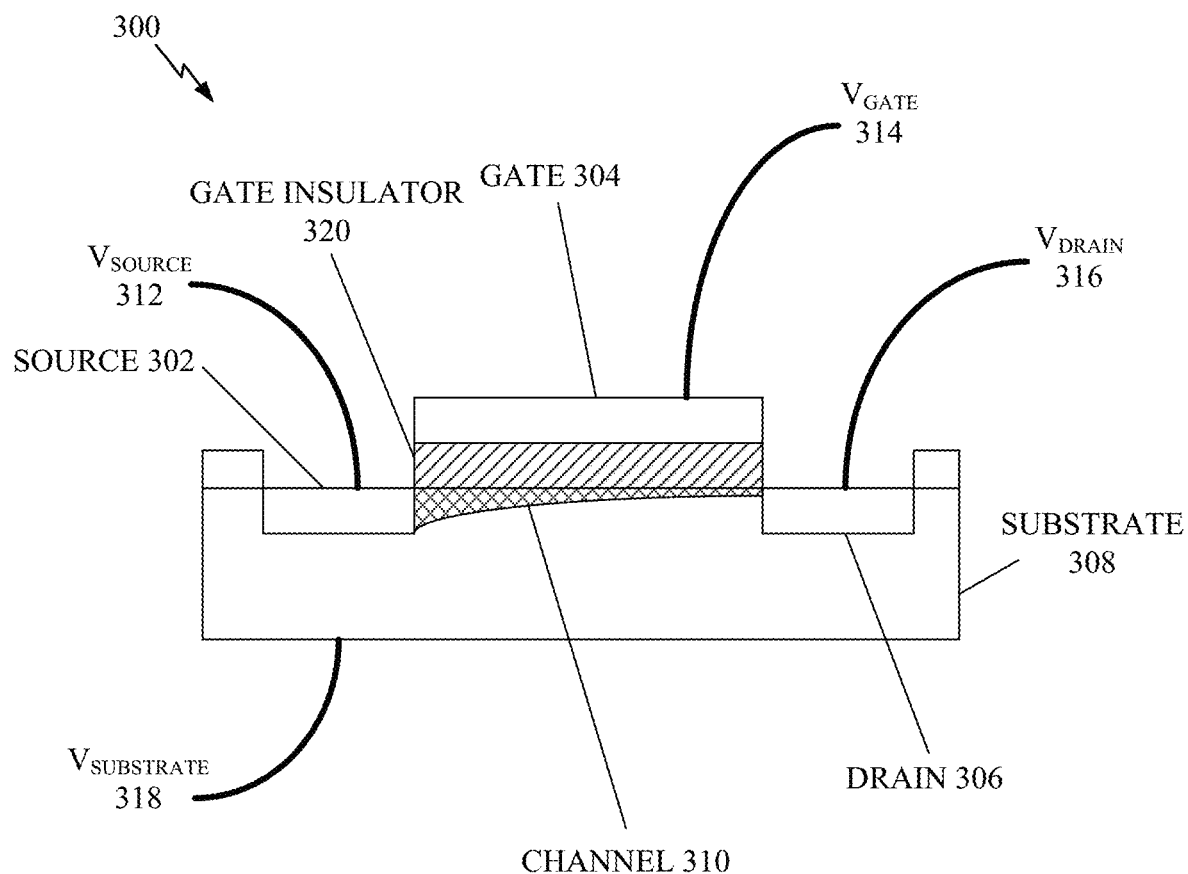
FIG. 3 illustrates a cross-sectional view of a metal-oxide-semiconductor field-effect transistor (MOSFET) device.
Figure 3:
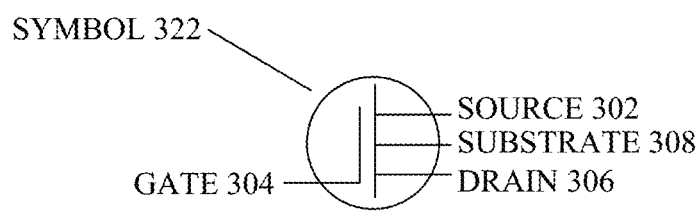

FIG. 3 illustrates a cross-sectional view of a metal-oxide-semiconductor field-effect transistor (MOSFET) device 300. The MOSFET device 300 may have four input terminals. The four inputs are a source 302, a gate 304, a drain 306, and a substrate 308. The source 302 and the drain 306 may be fabricated as high doped source or drain areas in the wells 202 and 204 in the substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but substrate 308 may also be one or more of the layers (e.g., 210-214) that are coupled to the substrate 200.

The MOSFET device 300 is a unipolar device, as current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate and inverse charge in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers accumulate an inverse charge in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a lower or higher potential than that of the voltage Vdrain 316 for NMOS or PMOS devices. Making the voltage differential between the voltage Vsource 312 and the voltage Vgate 314 larger will open the channel 310. Further, a larger voltage differential between Vsource 312 and Vdrain 316 will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in the present disclosure.

In some MOSFET designs, a high-k value material may be desired in the gate insulator 320, and in such designs, other conductive materials may be employed for the gate. For example, and not by way of limitation, a "high-k metal gate" design may employ a metal, such as Cu, TiN, or W, for the gate 304 terminal. Although referred to as "metal," polycrystalline materials, alloys, or other electrically conductive materials are contemplated as appropriate materials for the gate 304 as described in the present disclosure.

Upon fabrication of the MOSFET device 300, a wafer assembly and packaging process may be performed to package the MOSFET device 300. Wafer assembly and packaging may involve a back-grind of a backside of the wafer after a bump process in the assembly housing to reduce a thickness of a silicon substrate. Back-grinding removes a backside gettering layer, but exposes the wafer or die to metal contamination during the assembly process. For example, a packaging process may drive a backside contaminant into a device active region, which may cause a junction to short in the MOSFET device 300. A special tuning back-grinding process may form a pseudo gettering layer, by creating micro-fractures on the backside of the wafer, and results in areas of residual stress in which the micro-fractures are formed. These micro-fractures cause the wafer or die to be too brittle, especially in a thin substrate. A wafer backside gettering layer is useful to protect the wafer from contamination during the fabrication process, for example, as shown in FIG. 4.

Figure 4:
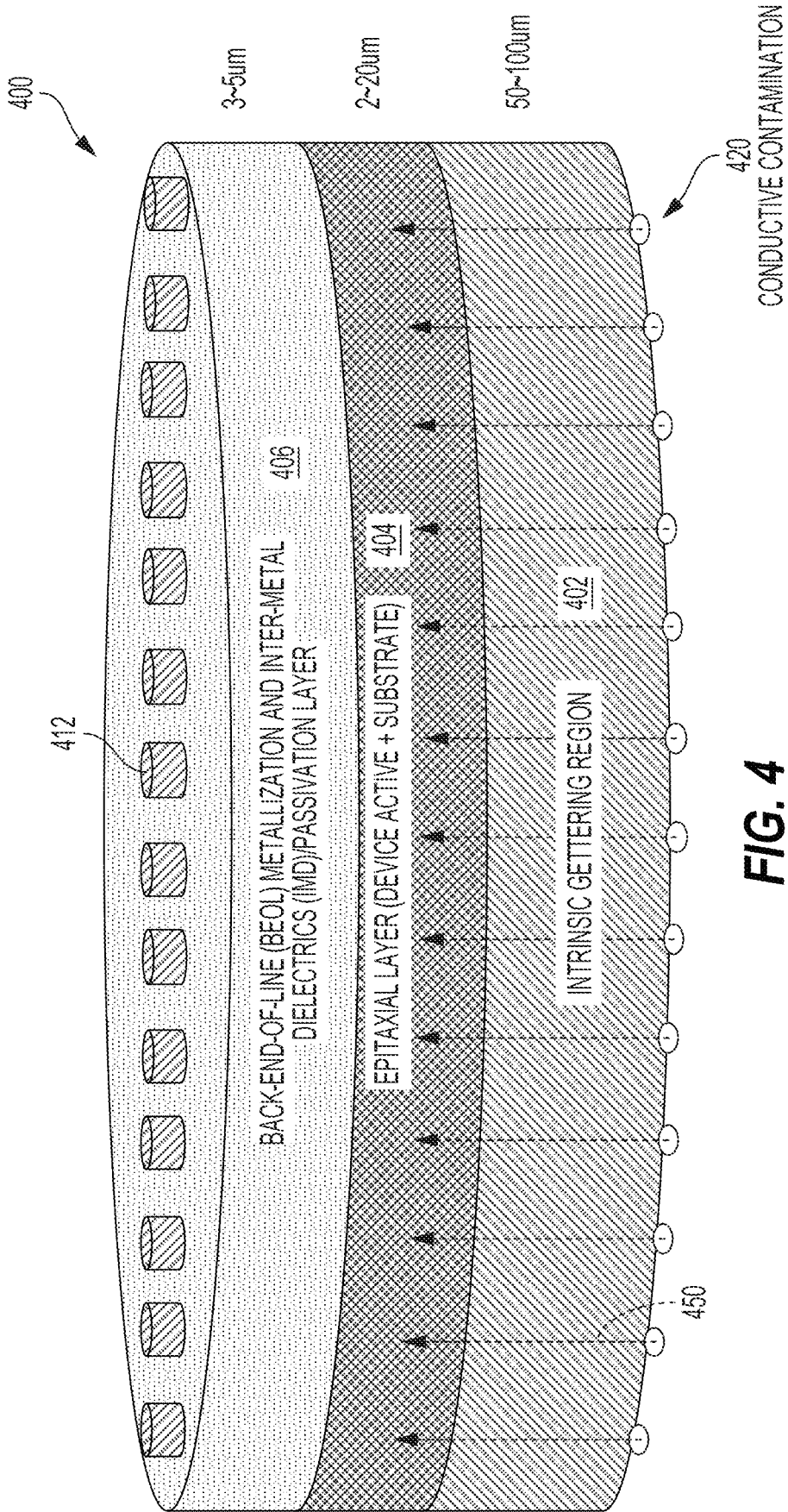
FIG. 4 illustrates an integrated circuit (IC) device including an intrinsic gettering region.

FIG. 4 illustrates an integrated circuit (IC) device 400 including an intrinsic gettering region 402. The intrinsic gettering region 402 supports an active device layer 404, and the active device layer 404 supports a back-end-of-line (BEOL) layer 406. The active device layer 404 may include the MOSFET device 300. Subsequent to fabricating the MOSFET device 300, a bump process may form conductive bumps 412 (e.g., copper pillars) on the BEOL layer 406. The intrinsic gettering region 402 may be used to protect the wafer, including the active device layer 404, from contamination during the fabrication process.

The intrinsic gettering region 402 may be formed from bare wafer processing form a backside gettering layer on a bare wafer. The backside gettering layer process creates defects within the wafer, which may act as gettering sites for trapping metal contamination 420 (e.g., copper, etc.), but it is weak and not capable of trapping contamination after the backside gettering layer is removed during assembly and packaging processing. As illustrated from the contamination path 450, a packaging reflow temperature may drive the metal contamination 420 from a backside of the device 400 to the active device layer 404. This results in degraded device reliability by causing devices to short at these junctions after high temperature stress is introduced. Additionally, after forming a pseudo backside gettering layer (e.g., a macro crack layer) from a back-grinding process, micro-fractures resulting from the back-grind process cause residual stress, making the wafer more susceptible to breaking. As wafers become thinner, the pseudo gettering regions formed by back-grinding become less tenable.

Accordingly, there is a need for overcoming the shortcomings of the gettering region by protecting the active device layer 404 of the device 400 from wafer backside contamination during fabrication.

Figure 5:
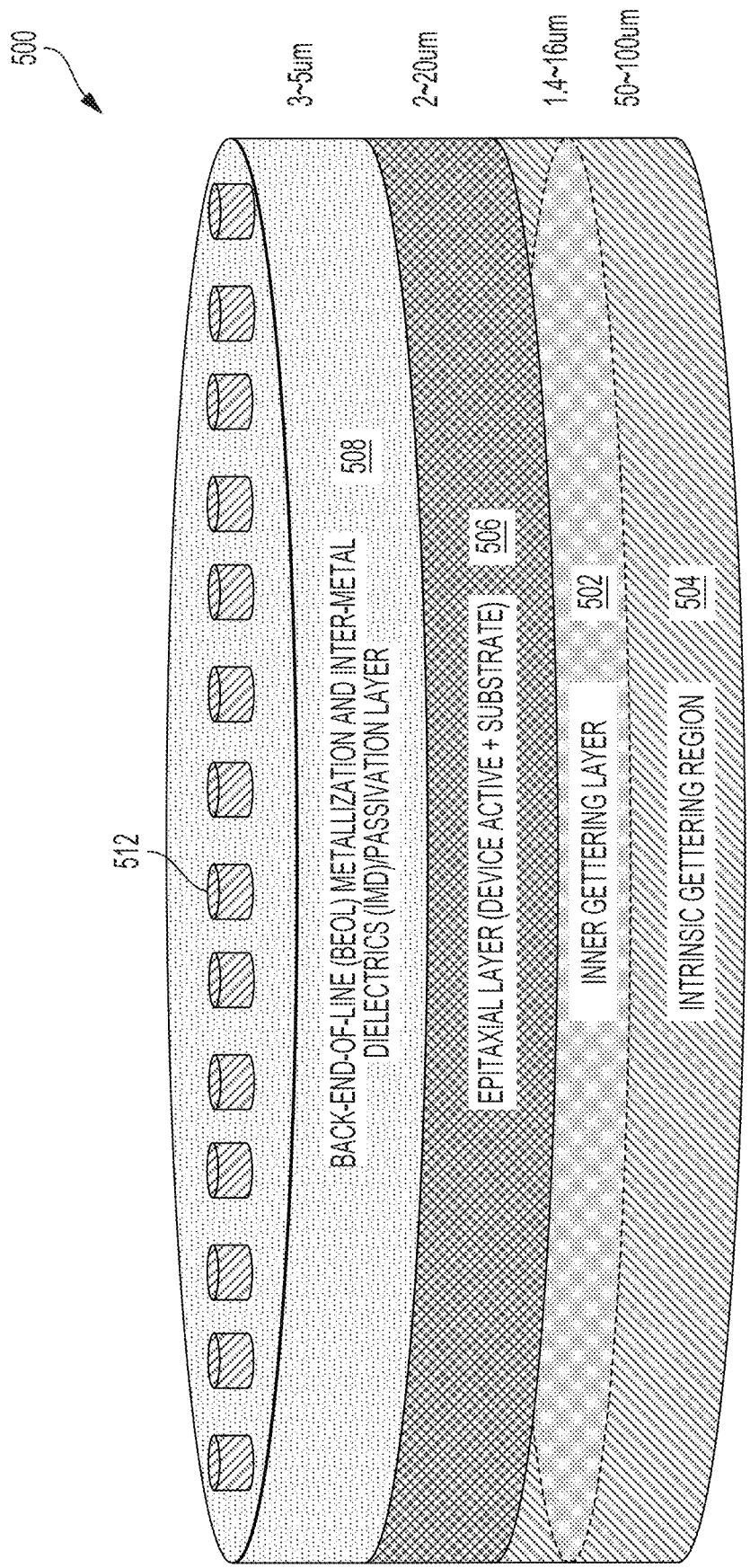
FIG. 5 illustrates an integrated circuit (IC) device including an inner gettering layer according to an aspect of the present disclosure.

FIG. 5 illustrates an integrated circuit (IC) device 500 including an inner gettering layer 502 (e.g., a first defect layer) according to an aspect of the present disclosure. The inner gettering layer 502 may be formed in and supported by an intrinsic gettering region 504 (e.g., a second defect layer). According to aspects, the intrinsic gettering region may be a thinned intrinsic gettering region. For example, the intrinsic gettering region may be thinned by a backgrind process.

The inner gettering layer 502 may support an active device layer 506. For example, the inner gettering layer 502 may have a first surface facing a backside of the active device layer 506. Additionally, the intrinsic gettering region 504 may face a second surface opposite the first surface of the inner gettering layer 502.

The active device layer 506 may support a BEOL layer 508. In addition, conductive bumps 512 (e.g., copper pillars) may be formed on the BEOL layer 508 through a bumping process. According to an inventive aspect, the BEOL layer 508 may include a metallization layer, an inter-metal dielectric (IMD) layer, as well as a passivation layer. The active device layer 506 may be an epitaxial layer that includes active devices on a substrate, such as, for example, the MOSFET device 300 shown in FIG. 3.

In this configuration, the intrinsic gettering region 504 may be 50-100 um thick. The inner gettering layer 502 may be 1.4 to 16 um thick. The active device layer 506 may be 2-20 um thick. The BEOL layer 508 may be 3-5 um thick. Of course, these values are exemplary only, and other thicknesses are possible.

FIGS. 6A-6D illustrate a fabrication process for an integrated circuit (IC) device that includes an inner gettering layer according to aspects of the present disclosure.

Figure 6A:
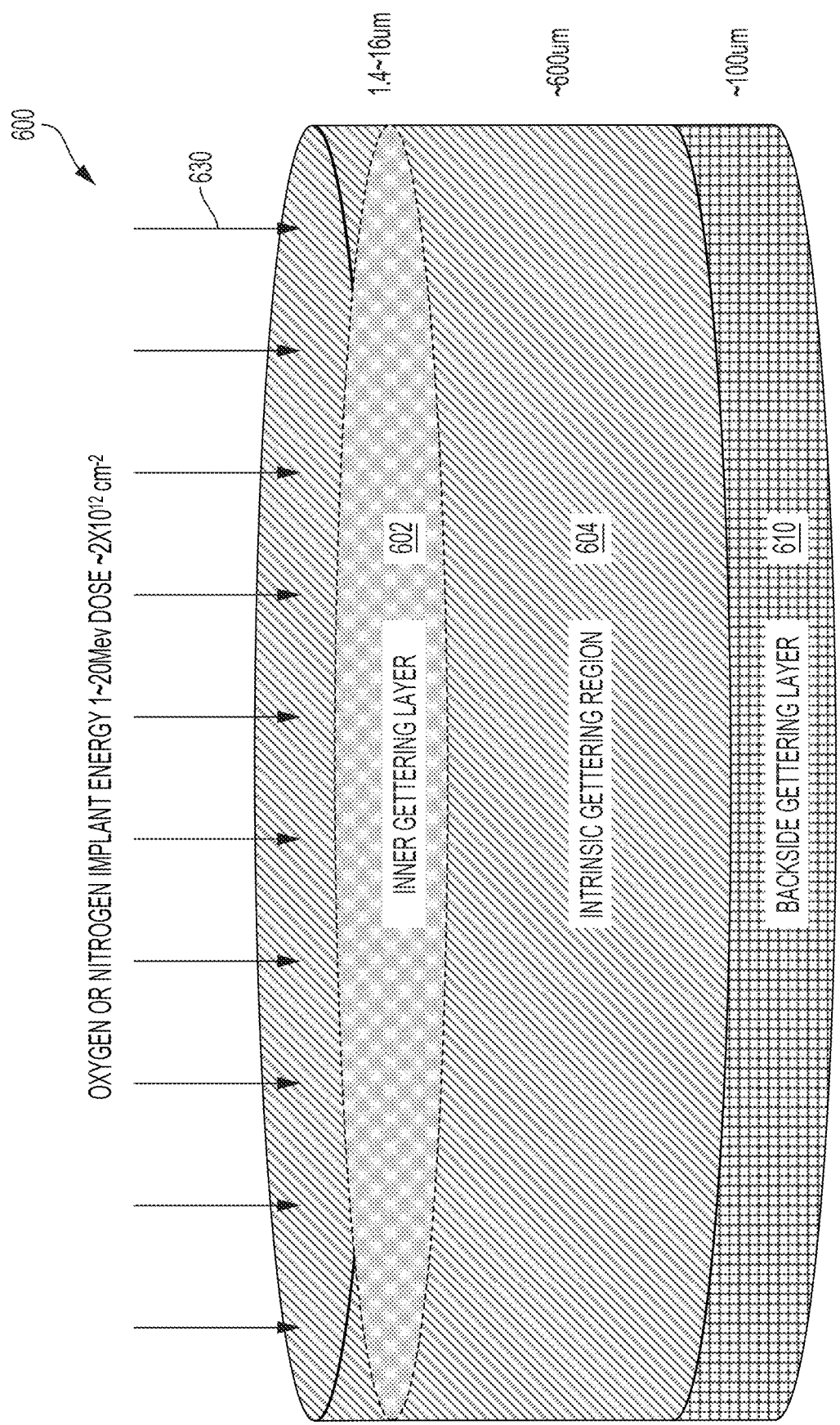
FIGS. 6A-6D illustrate a fabrication process for an integrated circuit (IC) device that includes an inner gettering layer according to aspects of the present disclosure.

FIG. 6A shows a semiconductor wafer 600 formed with a backside gettering layer 610 supporting an intrinsic gettering region 604. The backside gettering layer 610 (e.g., backside barrier layer) may be formed by a bare wafer process to create micro-fractures, which act as gettering sites. The intrinsic gettering region 604 may be portions of the semiconductor wafer 600 with intrinsic impurities, which may also act as weak gettering sites. According to an inventive aspect, the backside gettering layer 610 may be around 100 um thick, and the intrinsic gettering region 604 may be around 600 um thick, as noted in FIG. 6A.

According to inventive aspects, the inner gettering layer 602 may be an ion-implanted layer. For example, after forming the backside gettering layer 610, impurities 630 may be implanted on a front-side of the semiconductor wafer 600 to form an inner gettering layer 602. For example, low doses of oxygen (O) or nitrogen (N) implants may be implanted at a high implant energy of 1 to 20 MeV, at a range of 1.4 to 16 um below a surface of the front-side of the semiconductor wafer 600. According to an inventive aspect, the oxygen and/or nitrogen dose may be around $2\times10^{12}$ cm$^{-2}$ to form a 15 to 20 ppm oxygen or nitrogen layer. The layer may include class sites and may not be a continual layer.

Additionally, high energy and high doses of phosphorous (P), arsenic (As), or boron (B) implants, or N+ or P+ diffusing dopants may be used to form the inner gettering layer 602. For example, N+, P+, phosphorous, or arsenic may be implanted at an energy of 1 to 10 MeV, at a range of 1 to 4.9 um or 0.65 to 4.1 um below the surface. According to an inventive aspect, the phosphorous, arsenic, or boron implants may be around $10^{15}$ cm$^2$, or may be a surface dopant around $10^{20}$ cm$^{-3}$ to $10^{22}$ cm$^{-3}$ of a barrier layer from a diffusion dopant. The N+ or P+ may be diffusion doped just below the surface.

After the implanting, a high temperature anneal process may finalize formation of the inner gettering layer 602. The high temperature anneal may form SiOx (silicon oxide) or SiNx (silicon nitride) class sites (e.g., precipitate layers) or inner N+ or P+ barrier layers inside the bulk silicon. For example, a SiOx or SiNx precipitate layer, or N+ or P+ barrier layer forms defects inside the bulk silicon to trap contaminants (e.g., metal atoms). The high temperature anneal may also repair damage from the high doses of phosphorous and/or arsenic implants.

According to an inventive aspect, the inner gettering layer 602 may be formed 20 to 40 um below the surface in a bare silicon region of the semiconductor wafer 600. After the inner gettering layer 602 is formed, an epitaxial layer process may further reduce silicon or semiconductor active surface defects and move the inner gettering layer 602 far below an active device region.

Figure 6B:
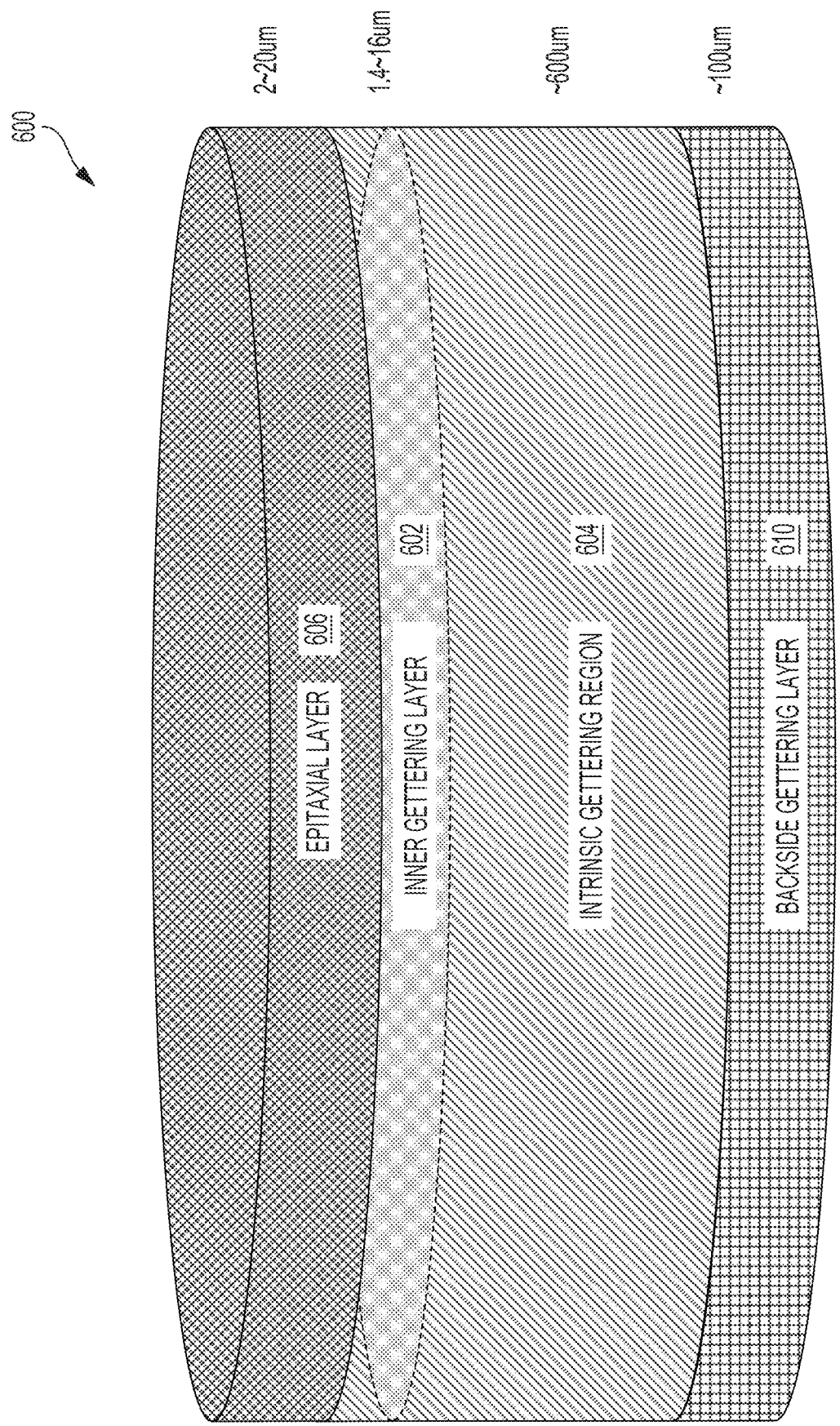

FIG. 6B shows growing an epitaxial layer 606 over the inner gettering layer 602. According to an inventive aspect, the epitaxial layer 606 may be 2 to 20 um thick. This value is exemplary only, and other values may be used. The epitaxial layer 606 may be for active devices, and may also serve as a substrate region. The epitaxial layer 606 may also control a N+ barrier layer below the bulk surface, which may be far from an active device region to avoid affecting the active devices.

Figure 6C:
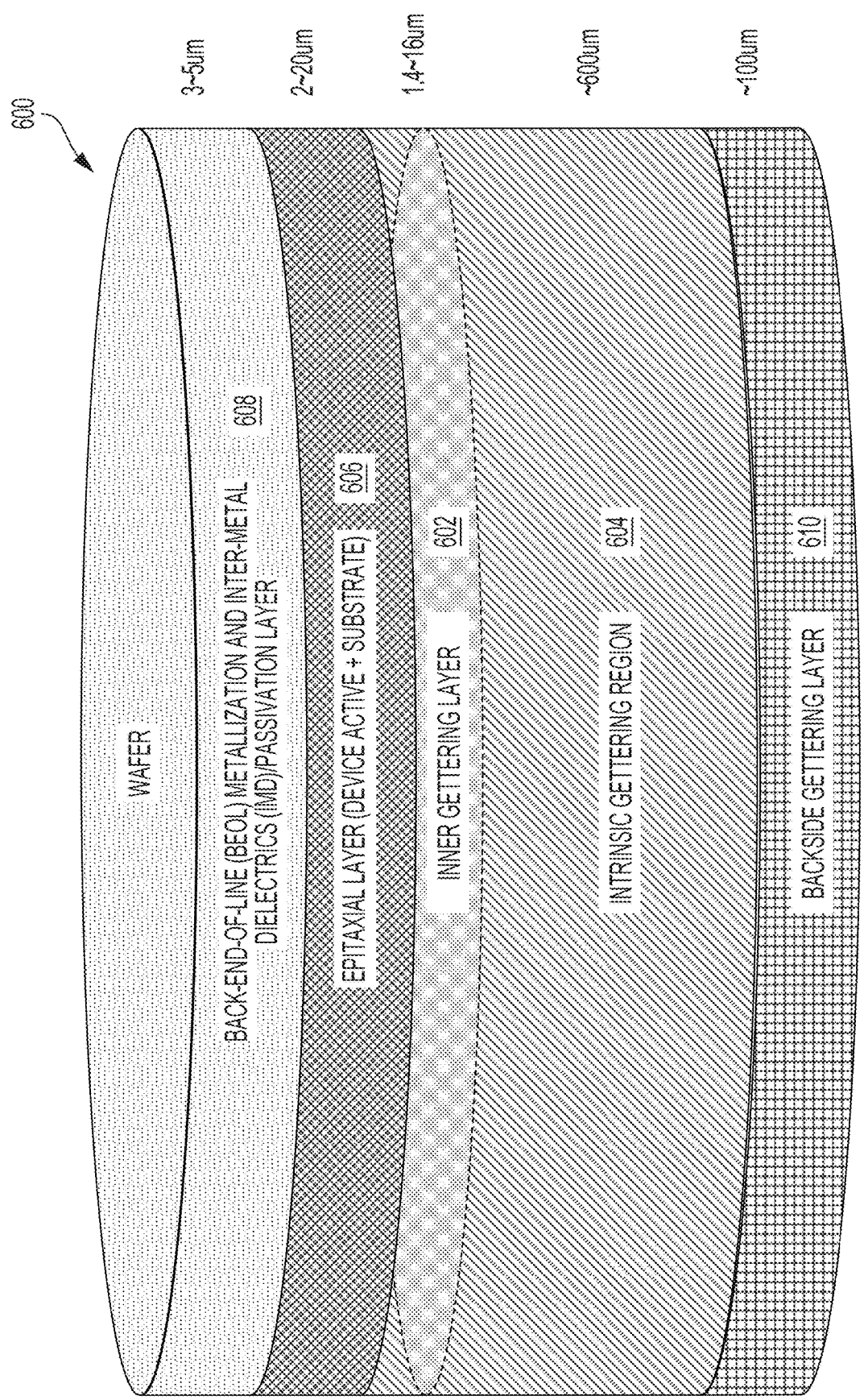

FIG. 6C shows a BEOL layer and passivation layer 608 formed on the epitaxial layer 606. The BEOL layer and passivation layer 608 may be formed from back-end-of-line (BEOL) processes, and may include an inter-metal dielectric (IMD) layer. Front-end-of-line (FEOL) processes may be used to form active devices on the semiconductor wafer 600. In this configuration, the passivation layer 608 may be 3 to 5 um thick.

Figure 6D:
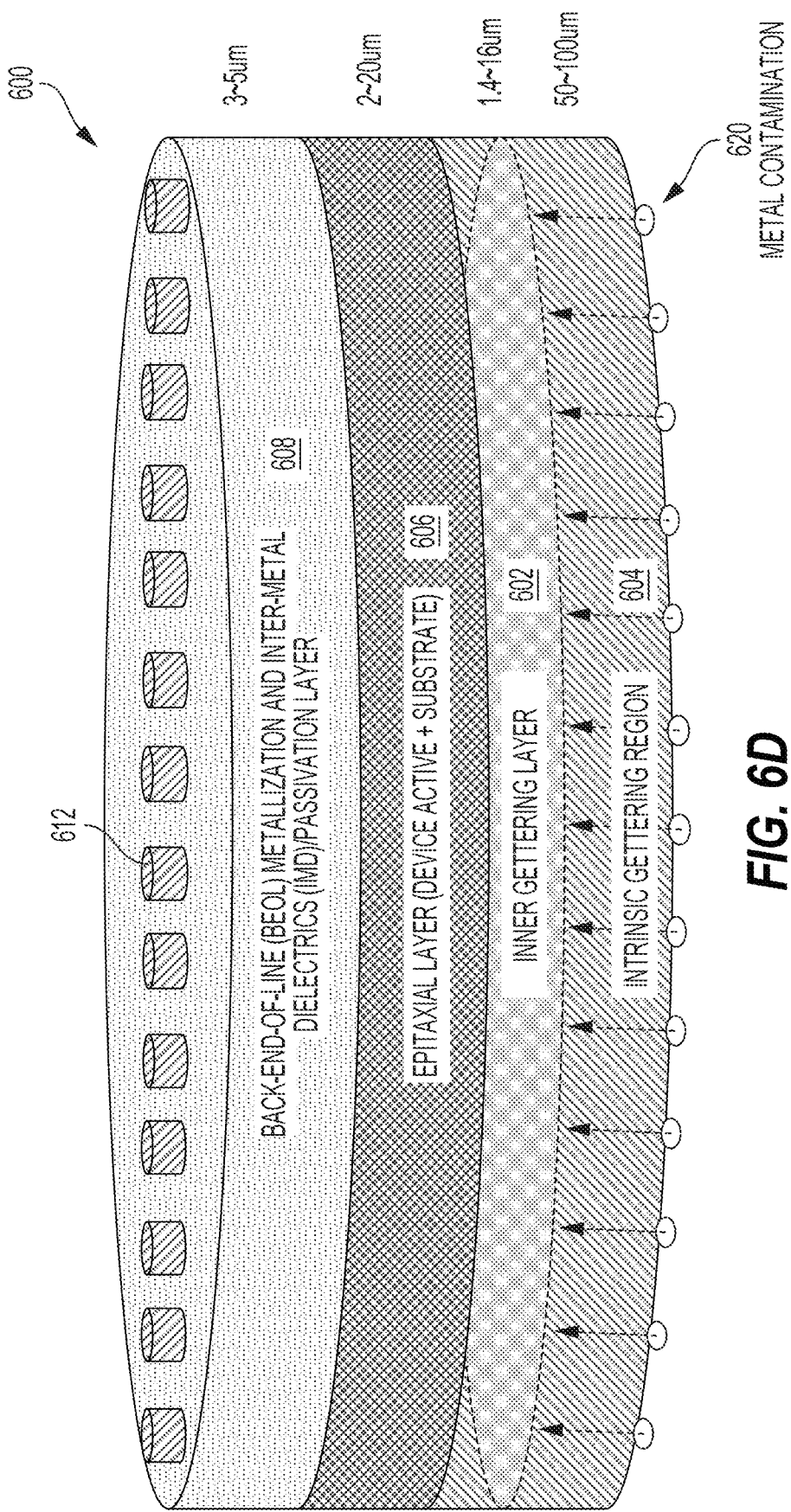

FIG. 6D shows the semiconductor wafer 600 once completed to include an inner gettering layer 602. The semiconductor wafer 600 may be thinned down by back-grinding 50 to 100 um off the backside after a bumping process to form conductive bumps 612 (e.g., copper pillars). For example, the backside gettering layer 610 may be completely removed and the intrinsic gettering region 604 may be partially removed. According to an inventive aspect, the remaining portion of the intrinsic gettering region 604 may be 50-100 um thick.

As the die is sawed and the packaging process continues, a reflow temperature of about 250° C. may drive the metal contamination 620 from the backside to the inner gettering layer 602. As shown, the inner gettering layer 602 traps the metal contamination 620. The inner gettering layer 602 also prevents the metal contamination 620 from reaching the remaining active device layers as a second layer for trapping contaminants during wafer fabrication process. Additionally, the inner gettering layer 602 is effective for protecting the active device regions from metal contamination during a wafer/chip assembly/packaging process as a primary gettering protection layer.

Advantages provided by the gettering layers include uniformly controlling a damage depth across a wafer (e.g., <0.1 um) and inside the substrate. The described gettering layers are also applicable to very thin die thicknesses (e.g., from 50 um to 1-5 um). The gettering layers may be used in compound semiconductor wafers (e.g., silicon III-V, II-VI, etc.). It is further noted that the values presented are exemplary only, and other values are possible without departing from the spirit and scope of the disclosure.

Figure 7:
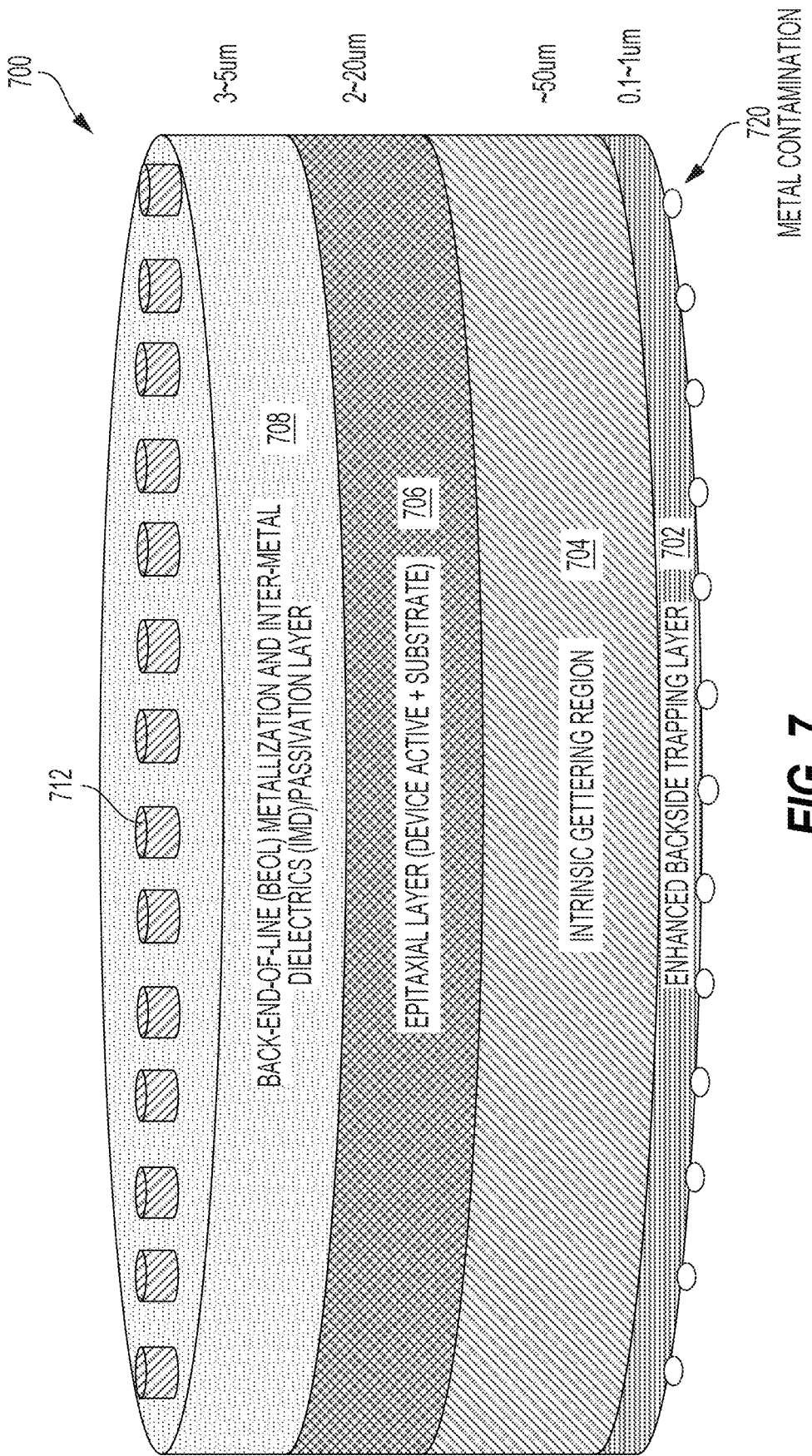
FIG. 7 illustrates an integrated circuit (IC) device including a backside trapping layer according to an aspect of the present disclosure.

FIG. 7 illustrates an integrated circuit (IC) device 700 including a backside trapping layer according to an aspect of the present disclosure. The backside trapping layer 702 may support an intrinsic gettering region 704. The intrinsic gettering region 704 may support an epitaxial layer 706. The epitaxial layer 706 may support a BEOL layer and passivation layer 708. In one configuration, the backside trapping layer 702 may be a damaged silicon layer that acts as an enhanced trapping layer to trap ions after a back-grind process to protect from metal contamination. For example, the backside trapping layer 702 may be formed by a post back-grinding process (e.g., to around 50 um, or to around 1 um) to introduce micro-fractures into the wafer after a bump process in an assembly housing.

Similar to the above, the intrinsic gettering region 704 may include impurities and defects that may act as gettering sites. The epitaxial layer may include active devices and a substrate. The BEOL layer and passivation layer 708 may include conductive bumps 712 (e.g., copper pillars.). In this configuration, the backside trapping layer 702 may be around 0.1 to 1 um thick, the intrinsic gettering region 704 may be around 50 um thick, the epitaxial layer 706 may be around 2 to 20 um thick, and the passivation layer 708 may be around 3 to 5 um thick. Of course, these values are exemplary only, and other thicknesses may be used.

The IC device 700 may be formed by mounting a wafer/die to the front of a transfer wafer. Similar to the above, a high-energy plasma treatment or implant process may be applied at a backside surface to form defects as an ion trapping layer or barrier layer (e.g., ion diffusion-trapping-layer, or diffusion-barrier-layers). The wafer/die may then be demounted from the transfer wafer, and a die saw or package process is continued. Afterwards, a packaging process at around 250° C. creates a reflow temperature that may drive conductive contamination 720 from the backside to the backside trapping layer 702, therefore, the device active region is protected.

Advantages of the inventive aspects include controlling the damage density (e.g., plasma or implant), damage depth/barrier thickness (e.g., dies), and uniformity of the gettering sites. In addition, the noted gettering layers may be implemented in extremely thin dies (e.g., plasma diffusion and implants do not specify thick dies or high die strength) for thinner devices. The inventive aspects may also be applied to both silicon wafers and GaAs III-V and II-VI compound semiconductor wafers.

Figure 8:
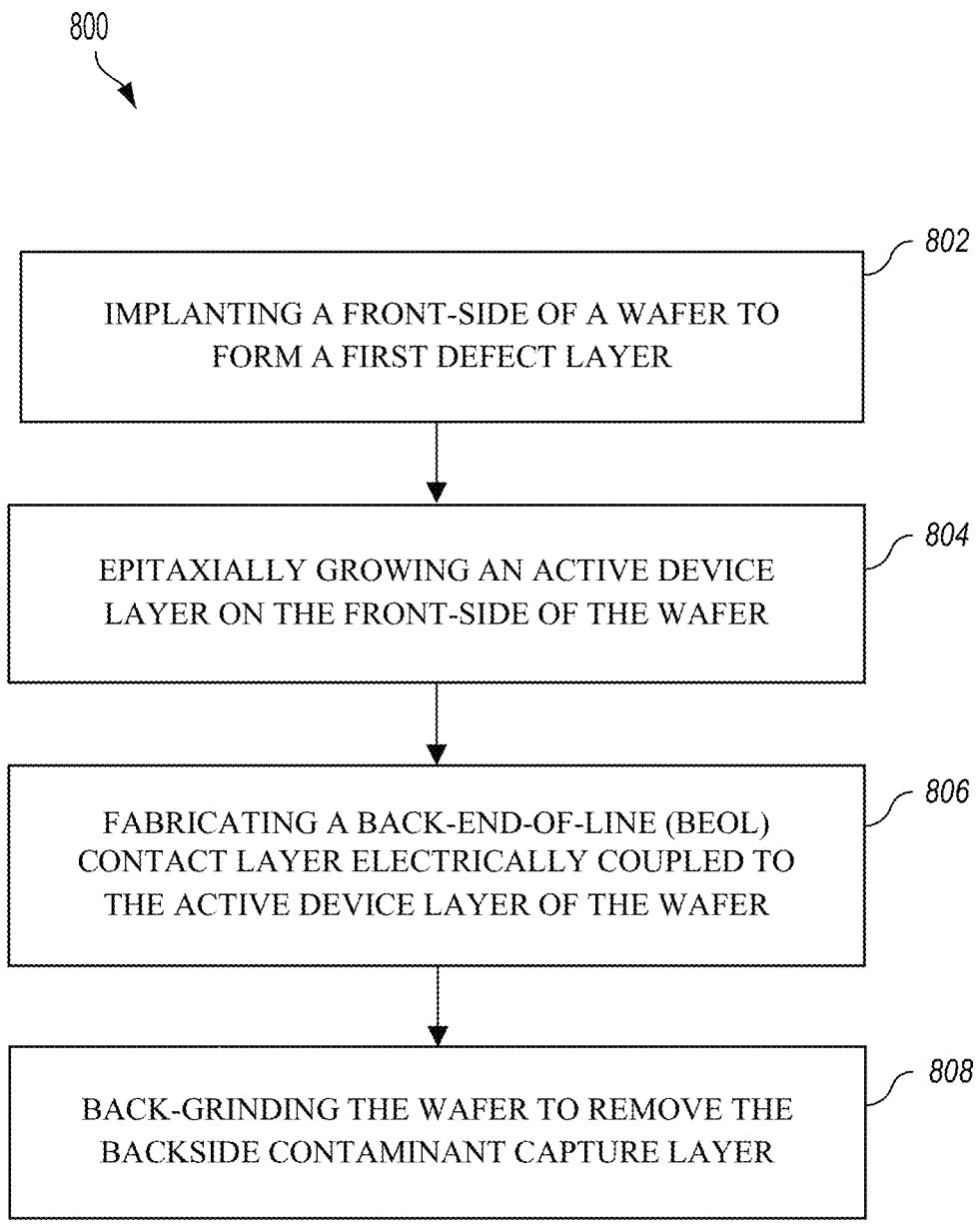
FIG. 8 is a flow diagram illustrating a method of fabricating an integrated circuit (IC) device that includes an inner gettering layer according to aspects of the present disclosure.

FIG. 8 illustrates a method 800 of fabricating an integrated circuit (IC) device that includes an inner gettering layer, according to aspects of the present disclosure. In block 802, a front-side of a wafer is implanted to form a first defect layer. The front-side of the wafer may include a backside contaminant capture layer. A second defect layer may face the first defect layer on a front-side of the second defect layer and the backside contaminant capture layer on a backside of the second defect layer. According to aspects, the second defect layer may include a thinned intrinsic gettering region. For example, an intrinsic gettering region may be thinned by a backgrind process.

As shown in FIG. 6A, the backside contaminant capture layer may be the backside gettering layer 610, the first defect layer may be the inner gettering layer 602, and the second defect layer may be the intrinsic gettering region 604. The second defect layer may be sandwiched between the first defect layer and the backside contaminant capture layer. In this arrangement, the second defect layer contacts the first defect layer and the backside contaminant capture layer. The backside contaminant capture layer may be formed by a back-grinding process prior to the implanting. According to an aspect, the front-side of the wafer is implanted with oxygen or nitrogen implants. The front-side of the wafer may form SiOx and/or SiNx layers after the implanting.

Referring again to FIG. 8, in block 804, an active device layer is epitaxially grown on the front-side of the wafer. As shown in FIG. 6B, the active device layer may be the epitaxial layer 606. In block 806, a back-end-of-line (BEOL) contact layer is fabricated and electrically coupled to the active device layer of the wafer. As shown in FIG. 6C, the BEOL layer may be the passivation layer 608. In block 808, the wafer is back-grinded to remove the backside contaminant capture layer. FIG. 6D shows back-grinding of the backside gettering layer 610 and a portion of the intrinsic gettering region 604.

In accordance with an aspect, the implanting may include diffusing N+ or P+ dopants into the front-side of the wafer. As shown in FIG. 6A, the N+ or P+ dopants may be diffused into the semiconductor wafer 600. In accordance with another inventive aspect, the method further includes annealing the front-side of the wafer after the implanting. As shown in FIG. 6A, a high temperature anneal may form SiOx or SiNx class sites (e.g., precipitate layers) or inner N+ or P+ barrier layers inside the bulk silicon.

According to the present disclosure, an integrated circuit device includes first means for capturing contaminants. For example, the first means for capturing contaminants may be the intrinsic gettering region 504, 604 (e.g., ion-implanted layer), as shown in FIGS. 5 and 6A-6D. According to the present disclosure, the integrated circuit device includes second means for capturing contaminants. For example, the second means for capturing contaminants may be the inner gettering layer 502, 602, as shown in FIGS. 5 and 6A-6D. In another aspect, the aforementioned means may be any module or any apparatus configured to perform the functions recited by the aforementioned means.

Aspects of the present disclosure are directed to an inner gettering layer. The inner gettering layer may be formed by introducing a damaged silicon layer on a backside of a wafer after die thinning. The damaged silicon will act as a trapping layer for ion contaminants, stopping contaminants (e.g., Cu) from diffusing into the active device region. The damaged layers may be formed on the backside surface of the die after die thinning by either a high-energy plasma treatment (such as N-plasma, to form SiN layer on wafer back surface), or a high-energy implant (such as N, O, etc., to form SiN layer, or SiO for ion trapping layer).

Figure 9:
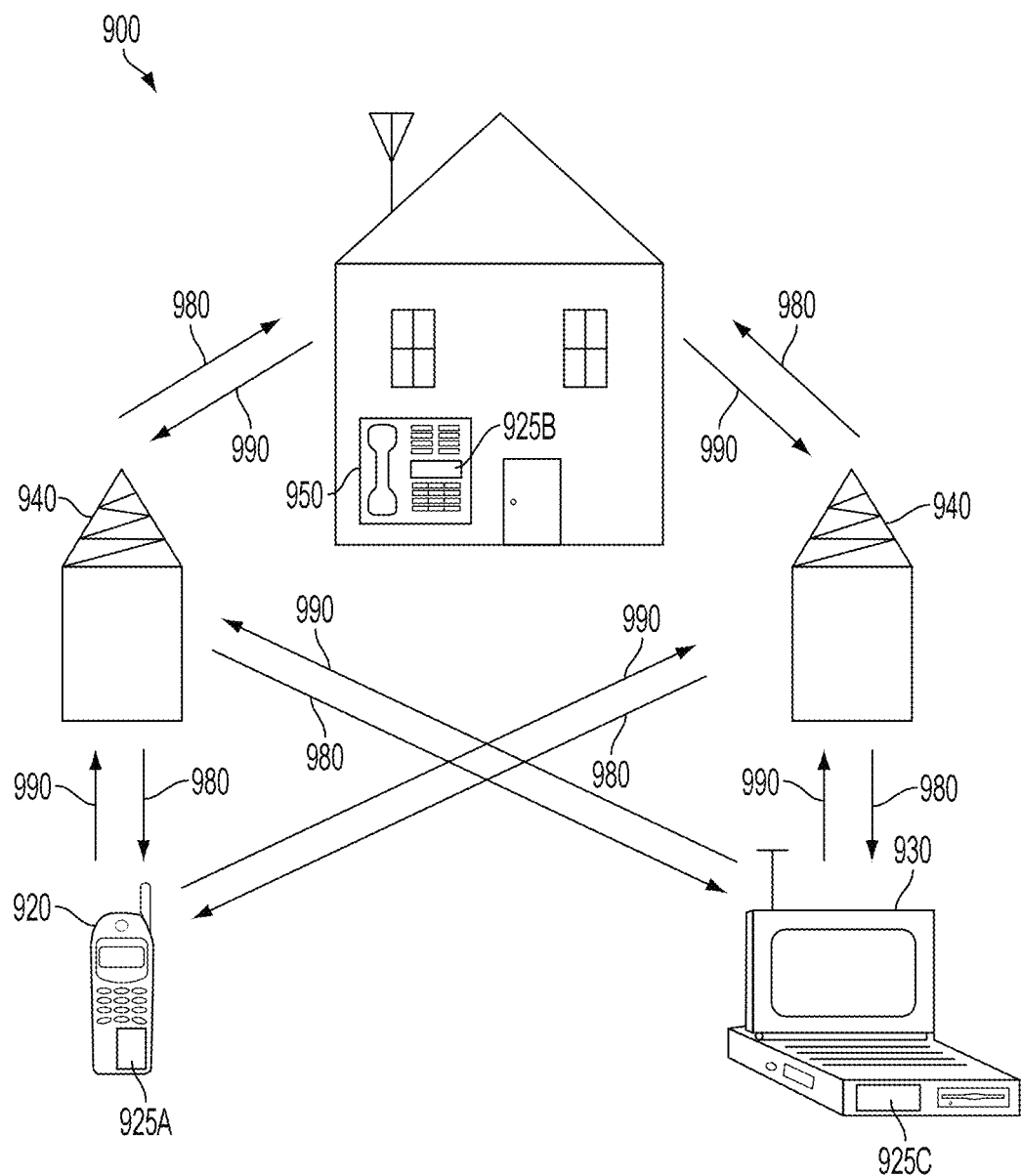
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three of the remote units 920, 930, and 950 and two of the base stations 940. It will be recognized that wireless communication systems may have many more remote units and base stations. Remote units 920, 930, and 950 include IC devices 925A, 925C, and 925B that include the disclosed IC structure with an inner gettering layer. It will be recognized that other devices may also include the disclosed IC structure with an inner gettering layer, such as the base stations, switching devices, and network equipment. FIG. 9 shows forward link signals 980 from one of the base stations 940 to the remote units 920, 930, and 950 and reverse link signals 990 from the remote units 920, 930, and 950 to base stations 940.

In FIG. 9, one of the remote units 920 is shown as a mobile telephone, one of the remote units 930 is shown as a portable computer, and remote unit 950 is shown as a fixed location remote unit in a wireless local loop system. For example, the remote units may be a mobile phone, a hand-held personal communication systems (PCS) unit, a portable data unit such as a personal digital assistant (PDA), a GPS enabled device, a navigation device, a set top box, a music player, a video player, a communications device, an entertainment unit, a fixed location data unit such as a meter reading equipment, or other devices that store or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed IC structure with an inner gettering layer.

Figure 10:
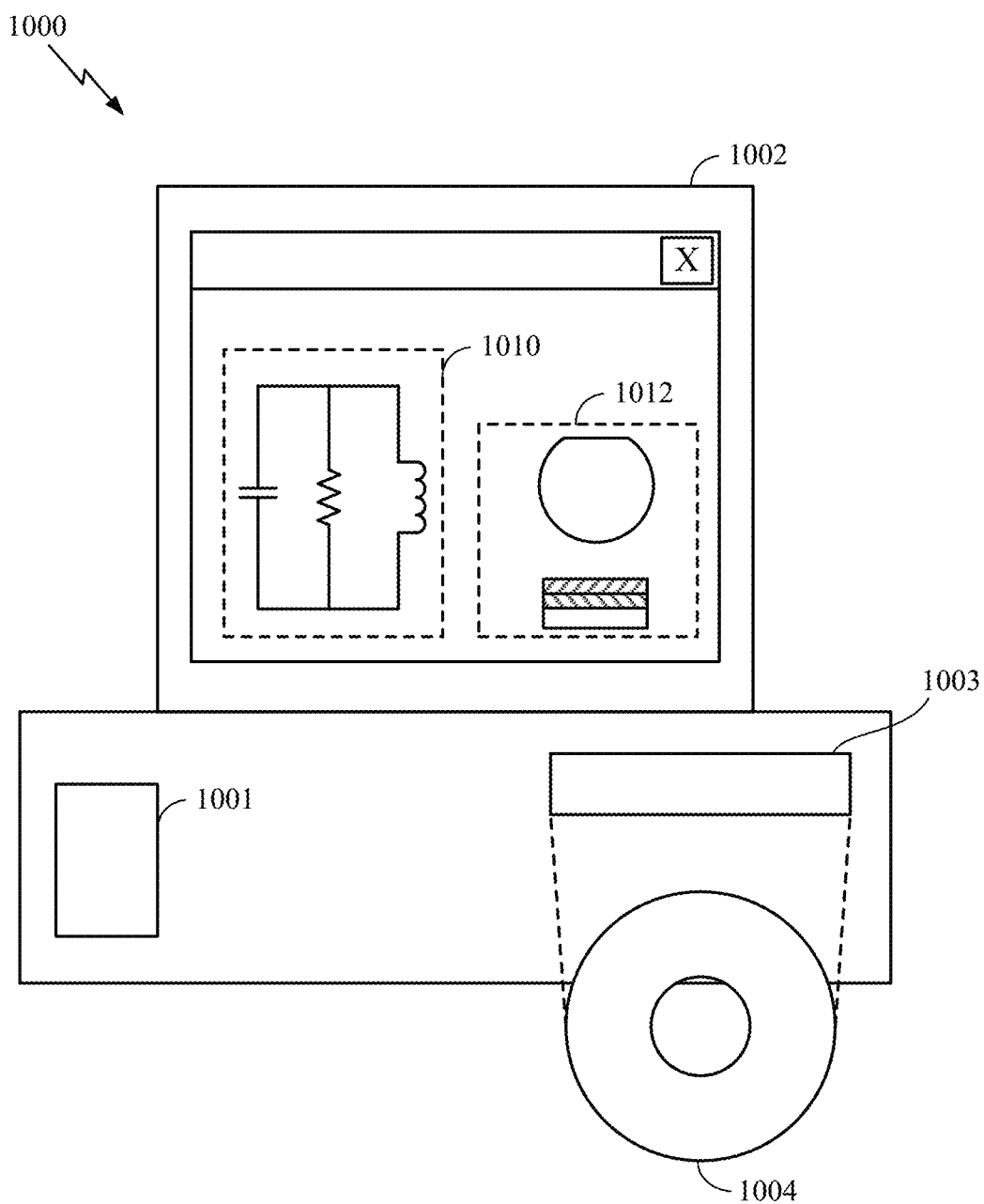
FIG. 10 is a block diagram illustrating a design workstation used for circuit, layout, and logic design.

FIG. 10 is a block diagram illustrating a design workstation used for circuit, layout, and logic design of the IC structure with an inner gettering layer disclosed above. A design workstation 1000 includes a hard disk 1001 containing operating system software, support files, and design software such as Cadence or OrCAD. The design workstation 1000 also includes a display 1002 to facilitate design of a circuit 1010 or IC structure with an inner gettering layer 1012. A storage medium 1004 is provided for tangibly storing the design of the circuit 1010 or the IC structure with an inner gettering layer 1012. The design of the circuit 1010 or the IC structure with an inner gettering layer 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the IC structure with an inner gettering layer 1012 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An integrated circuit (IC) device, comprising:
   a substrate region including:
      an active device layer;
      a first defect layer comprising an implanted impurity layer including trapped contamination from a second defect layer, the first defect layer having a first surface facing a backside of the active device layer and a second surface opposite the first surface; and
      a second defect layer facing the second surface of the first defect layer, the second defect layer directly contacting the second surface of the first defect layer, in which the substrate region comprises an epitaxial layer directly on the first surface of the first defect layer, the epitaxial layer including the active device layer.

2. The IC device of claim 1, in which the second defect layer comprises a backside barrier layer.

3. The IC device of claim 2, in which the backside barrier layer comprises micro-fractures.

4. The IC device of claim 1, further comprising a back-end-of-line (BEOL) contact layer electrically coupled to the active device layer.

5. The IC device of claim 1, in which the first defect layer comprises SiOx and/or SiNx.

6. The IC device of claim 1, in which the first defect layer comprises an ion-implanted layer.

7. The IC device of claim 6, in which the ion-implanted layer comprises O or N implants.

8. The IC device of claim 1, in which the second defect layer comprises a thinned intrinsic gettering region.

9. The IC device of claim 1, integrated into a chip, the chip incorporated into at least one of a music player, a video player, an entertainment unit, a navigation device, a communications device, a personal digital assistant (PDA), a fixed location data unit, a mobile phone, and a portable computer.

10. A method of fabricating an integrated circuit (IC) device in a wafer including a backside contaminant capture layer and a second defect layer, comprising:
   implanting a front-side of the wafer to form a first defect layer in the front-side of the wafer, in which the second defect layer directly contacts a second surface of the first defect layer and directly contacts the backside contaminant capture layer;
   epitaxially growing an epitaxial layer on a first surface of the first defect layer, the epitaxial layer including an active device layer on the front-side of the wafer;
   fabricating a back-end-of-line (BEOL) contact layer electrically coupled to the active device layer of the wafer;
   back-grinding the wafer to remove the backside contaminant capture layer; and
   annealing the front-side of the wafer after the implanting to trap contamination from the second defect layer in an implanted impurity layer of the first defect layer.

11. The method of claim 10, in which the implanting comprises diffusing dopants into the front-side of the wafer.

12. The method of claim 10, in which the implanting comprises implanting the front-side of the wafer with P, As, B, O, or N implants.

13. The method of claim 12, in which the front-side of the wafer comprises SiOx and/or SiNx after the implanting.

14. The method of claim 10, in which the second defect layer comprises a thinned intrinsic gettering region.

15. The method of claim 10, further comprising integrating the IC device into a chip, the chip incorporated into at least one of a music player, a video player, an entertainment unit, a navigation device, a communications device, a personal digital assistant (PDA), a fixed location data unit, a mobile phone, and a portable computer.

16. An integrated circuit (IC) device, comprising:
   a substrate region including:
      an active device layer;
      a first defect layer comprising an ion-implanted impurity layer including trapped contamination from a means for capturing contaminants, the first defect layer having a first surface facing a backside of the active device layer; and
      the means for capturing contaminants facing a second surface of the first defect layer opposite the backside of the active device layer and directly contacting the first defect layer, in which the substrate region comprises an epitaxial layer directly on the first contaminants defect layer, the epitaxial layer including the active device layer.

17. The IC device of claim 16, in which the means for capturing contaminants comprises a backside barrier layer.

18. The IC device of claim 16, in which the means for capturing contaminants comprises a thinned intrinsic gettering region.

19. The IC device of claim 16, integrated into a chip, the chip incorporated into at least one of a music player, a video player, an entertainment unit, a navigation device, a communications device, a personal digital assistant (PDA), a fixed location data unit, a mobile phone, and a portable computer.

* * * * *